United States Patent
Huynh

(10) Patent No.: US 8,842,409 B2
(45) Date of Patent: Sep. 23, 2014

(54) ELECTRONIC CONTROL PANEL WITH PROTECTION AGAINST ELECTROSTATIC DISCHARGES

(75) Inventor: Tan Duc Huynh, Neuilly-sur-Marne (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 235 days.

(21) Appl. No.: 13/322,749

(22) PCT Filed: May 31, 2010

(86) PCT No.: PCT/FR2010/000406
§ 371 (c)(1),
(2), (4) Date: Jan. 27, 2012

(87) PCT Pub. No.: WO2010/136679
PCT Pub. Date: Dec. 2, 2010

(65) Prior Publication Data
US 2012/0120541 A1    May 17, 2012

(30) Foreign Application Priority Data

May 29, 2009  (FR) ..................................... 09 53564

(51) Int. Cl.
*H01H 47/00* (2006.01)
*H05F 3/00* (2006.01)
*H05F 3/02* (2006.01)
*H05K 9/00* (2006.01)
*B60R 11/02* (2006.01)

(52) U.S. Cl.
CPC ........... *H05K 9/0067* (2013.01); *B60R 11/0264* (2013.01)
USPC ........................................................... 361/220

(58) Field of Classification Search
USPC ........................................................... 361/220
See application file for complete search history.

(56) References Cited

U.S. PATENT DOCUMENTS

| 5,312,263 | A | 5/1994 | Zapalski et al. |
| 6,111,244 | A * | 8/2000 | Wang .................... 250/208.1 |
| 2007/0121308 | A1 | 5/2007 | Chiang |
| 2007/0253127 | A1 | 11/2007 | Sanefuji et al. |
| 2010/0161220 | A1* | 6/2010 | Masuda et al. ................ 701/208 |

FOREIGN PATENT DOCUMENTS

| JP | 2002-093262 A | 3/2002 |
| WO | 2005/009798 A1 | 2/2005 |

OTHER PUBLICATIONS

International Search Report issued in PCT/FR2010/000406, mailed on Aug. 18, 2010, 2 pages.

* cited by examiner

*Primary Examiner* — Dharti Patel
(74) *Attorney, Agent, or Firm* — Osha Liang LLP

(57) ABSTRACT

The present invention relates to an outer wall for electronic control (300; 400; 500), particularly comprising: an outer portion (1) which includes at least one button (5; 6) and a fixed portion (2), each button (5; 6) and said fixed portion (2) having an opening (3) therebetween; an inner portion (310; 410; 510) which includes, in particular, a printed circuit (12); characterized in that the outer wall (300; 400; 500) comprises at least one metal part (320; 420; 520; 530) capable of capturing, at at least one of the openings (3), static electricity which would likely affect the printed circuit (12) in the absence of said metal part (320; 420; 520; 530).

9 Claims, 3 Drawing Sheets

Figure 5:
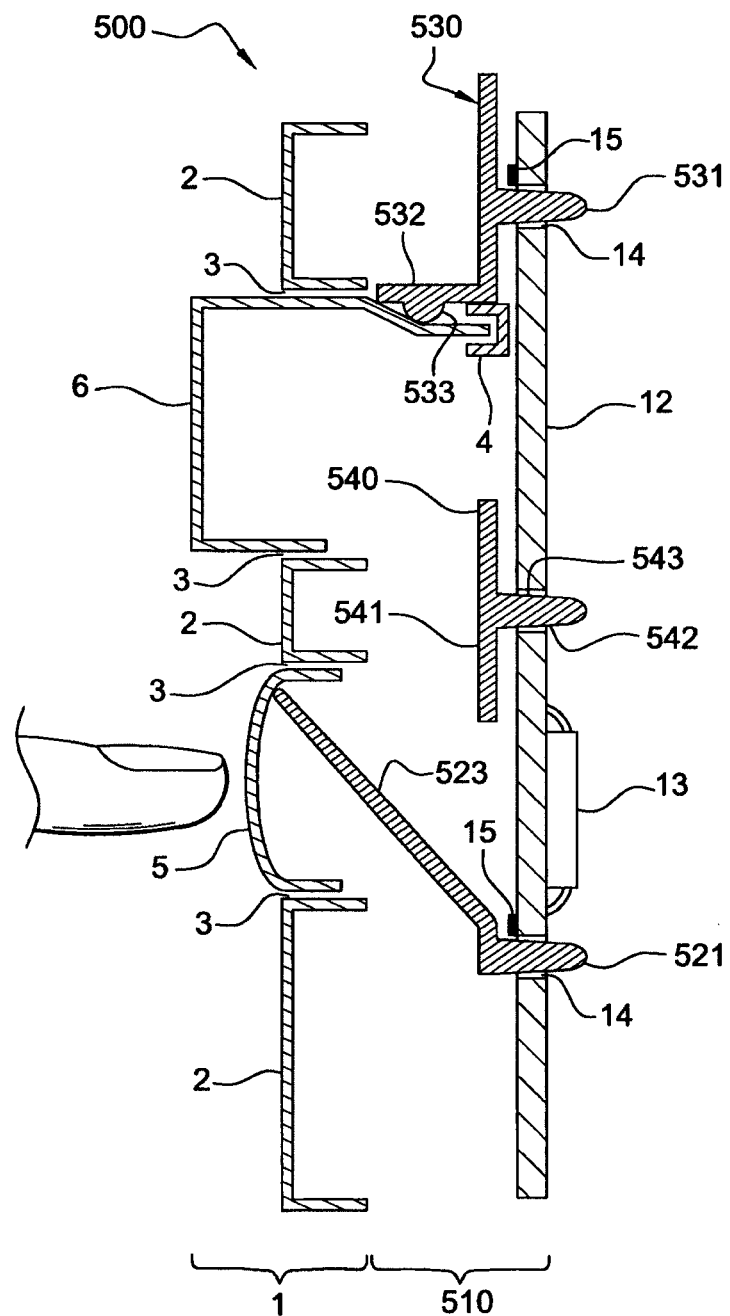

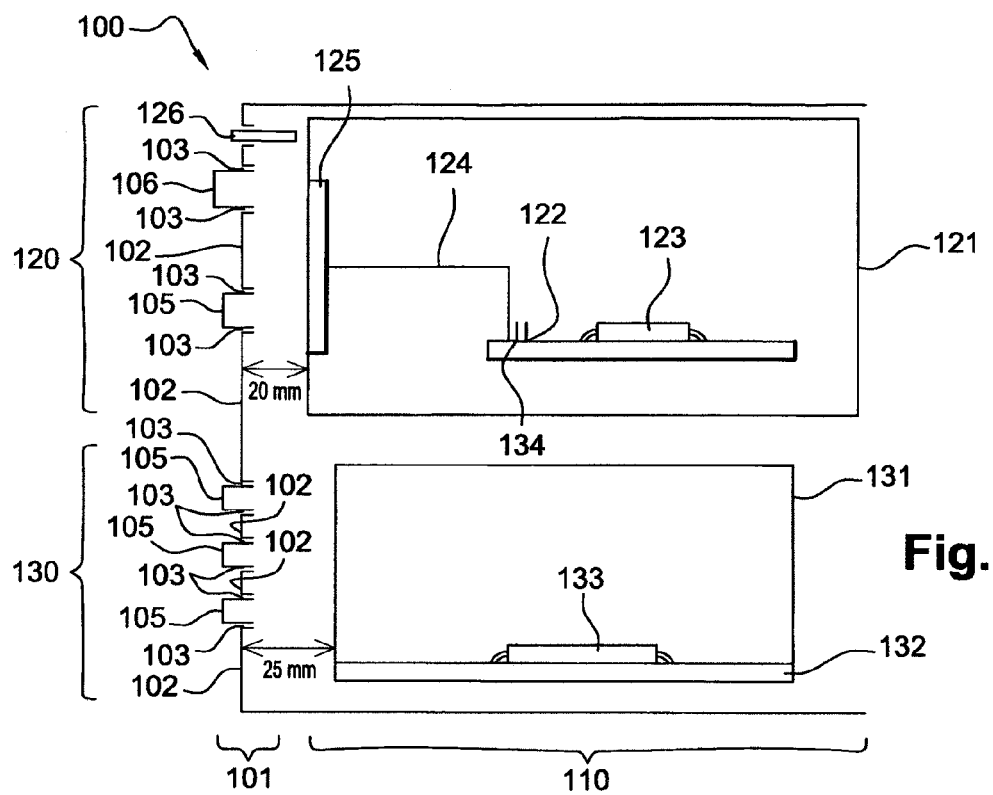
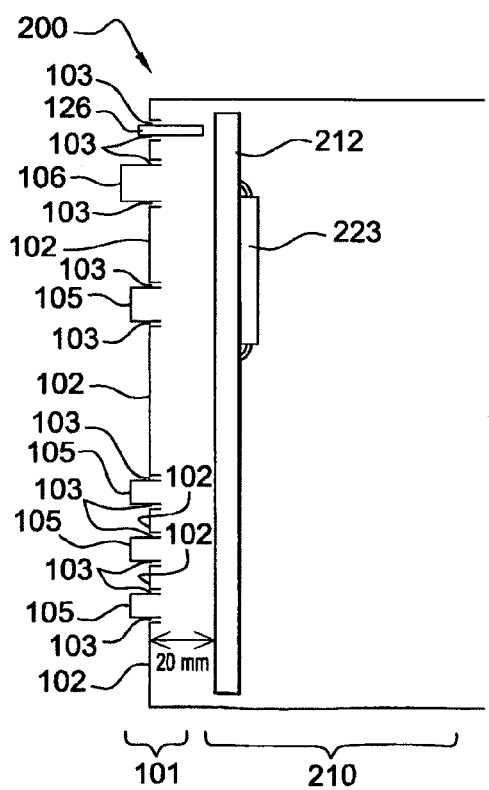

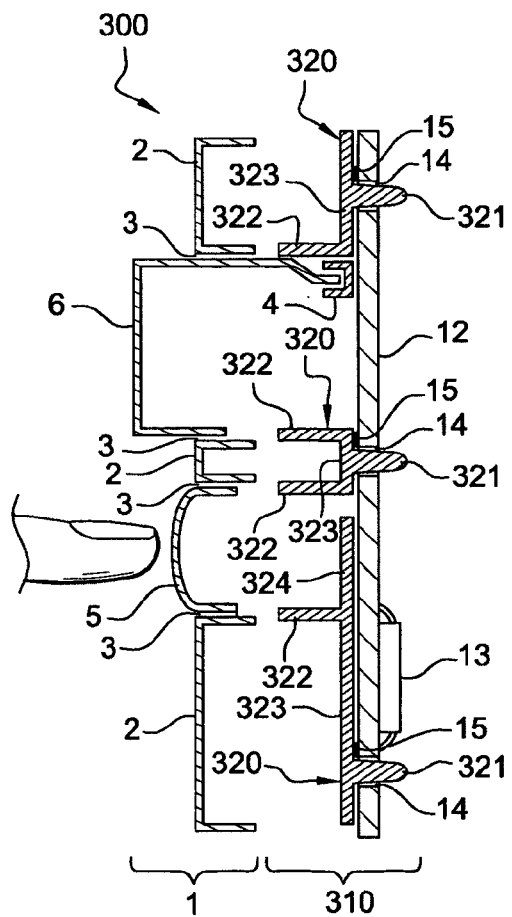
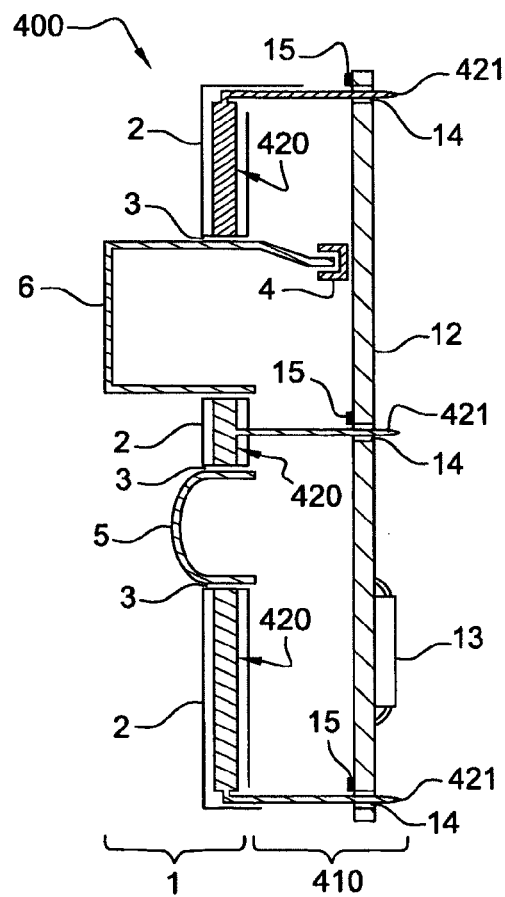
Fig. 3
Fig. 4

ELECTRONIC CONTROL PANEL WITH PROTECTION AGAINST ELECTROSTATIC DISCHARGES

The present invention relates to an electronic control panel with protection against electrostatic discharges. Its main purpose is to secure the operation of the various applications controlled by a user from the dashboard.

The field of the invention is, generally, that of the protection of electronic components, for example those present in the dashboard of a vehicle. The invention will be more particularly described in the context of the multiplexed panels of automobiles, but its scope naturally extends to any type of electronic control panel.

An automobile is commonly equipped with an accessory, such as a car radio, a system for conditioning the air contained inside the passenger compartment of the vehicle, or even, for example, a navigation system. The accessory is a comfort item, that is to say an optional appliance which is not essential to a primary and critical function of the vehicle, namely its movement.

In many current dashboards, there is a modular panel design: there is a specific block for a car radio and a separate block for an air conditioning system, in one and the same dashboard of a vehicle. The advantage of this modular design is that it offers a plurality of combinations with top-end products and bottom-end products. For example, there is the possibility of combining top-end or bottom-end car radio and air conditioning, but also of having a top-end car radio with a bottom-end air conditioning system, and vice versa.

FIG. 1 represents a panel with modular design 100, comprising an external part 101 and an internal part 110, that is to say, a visible part and a part that is not visible to a user. The external part 101 notably comprises two panels, a car radio panel 120 and an air conditioning control panel 130. The internal part 110 comprises a car radio unit 121 and an air conditioning unit 131.

The car radio panel 120 notably comprises, in this example, a fixed part 102, a disk slot 126, a number of pushbuttons 105 and a rotary selector 106. Between each button (105 and 106), the fixed part 102 and the disk slot 126, there are openings 103. The maximum distance between the fixed part 102 and the car radio unit 121 is approximately twenty millimeters in order to allow the disk to be taken in. The car radio unit 121 comprises an electronic card 125 in a vertical position, linked to a first printed circuit 122 in a horizontal position, by a ribbon cable 124. A first microprocessor 123 is connected to the printed circuit 122.

The air conditioning panel 130 notably comprises a fixed part 102, pushbuttons 105 and openings 103. The air conditioning unit 131 comprises a second printed circuit 132 in a horizontal position, to which a second microprocessor 133 is connected.

When a user moves his finger towards the external part 101, that is to say, the car radio panel 120 and/or the air conditioning panel 130, there is a potential difference, and a discharge occurs when the finger approaches the plastic of said external part 101, whether this is button (105; 106) or similar. Air situated at the openings 103 of one of the equipment items (car radio and/or air conditioning), conducts static electricity at a rate of one kilovolt per millimeter. In summer, when the air is drier, the discharge can reach 25 kilovolts or a distance of 25 millimeters.

In the car radio unit 121, neither the printed circuit 122 nor the microprocessor 123 is exposed to the static electricity of the user because the capacitor 134 is designed to absorb this static electricity, and thus to protect the printed circuit 122 and the microprocessor 123 situated after it.

The air conditioning unit 131 is at a distance greater than twenty-five millimeters from the air conditioning panel 130, so there is no static electricity discharge problem.

There are many drawbacks with the modular design: the modules are manufactured by two different equipment manufacturers, which implies two different technologies; the button sensations, the light intensity and the hue and color are therefore different.

Today's automobile owner is demanding when it comes to the aesthetics of his or her vehicle. Document WO2005/009798 discloses solutions for satisfying the aesthetism demands regarding the external part 101 of the panel. Thus, a multiplexed panel is now proposed which integrates the two blocks, car radio and air conditioning, aesthetically. This multiplexed panel simplifies the connection of links in the units by another arrangement of the electronic components; the multiplexed panel thus allows for the configuration to be changed easily.

FIG. 2 represents a multiplexed panel 200 as implemented in the prior art. This multiplexed panel 200 comprises the same external part 101 as in FIG. 1, and an internal part 210, respectively corresponding to a visible part and a part that is not visible to a user.

The external part 101 therefore mainly consists of the same elements as in FIG. 1, that is to say, a fixed part 102, a disk slot 126, a number of pushbuttons 105 and a rotary selector 106. As in FIG. 1, there are the openings 103.

The internal part 210 comprises a printed circuit 102 in a vertical position, to which a microprocessor 223 is connected.

The maximum distance between the fixed part 102 and the printed circuit 212 is twenty millimeters in order to allow the disk to be taken in. A static electricity discharge problem therefore directly affects the printed circuit 212 and the microprocessor 223 which is connected to it.

With the development of this product, static electricity problems have been discovered: they are notably due to the handling of the equipment concerned by a user.

As explained previously, the static electricity of the user is damaging for the electronic components. If the electronic components of the equipment are situated at a distance less than twenty-five millimeters, which is the case with the printed circuit 212 of the panel, they are then damaged or even destroyed.

Despite the many advantages of this multiplexed panel, the major drawback is the threat to the lifespan of the electronic components posed by static electricity transmitted by the user.

The panel according to the invention notably makes it possible to resolve the problem described above. In the invention, a solution is proposed so that the electrostatic discharges generated by the user are no longer likely to damage the electronic components of the comfort equipment of a vehicle; to this end, in the invention, it is proposed to add protection elements that make it possible to remove the static electricity originating from the electrostatic discharges.

The electronic control panel according to the invention has a number of advantages, notably in terms of savings on the repair or replacement of the electronic components, because of their optimized protection. Secondarily, the protection elements fulfill mechanical functions associated with the movement of the panel buttons.

The invention therefore relates mainly to an electronic control panel notably comprising:
- an external part (1) comprises at least one button and a fixed part, each button and said fixed part having an opening between them;
- an internal part which notably comprises a printed circuit; characterized in that the panel comprises at least one metal piece suitable for picking up static electricity, present at at least one of the openings and likely to affect the printed circuit in the absence of said metal piece.

In addition to the main characteristics that have just been mentioned in the preceding paragraph, the panel according to the invention may have one or more additional characteristics out of the following:
- the metal piece is linked to an electric ground line;
- the metal piece includes at least one conductive tab linked to the electric ground line of the printed circuit and inserted into a cavity of said printed circuit, to produce a securing function for said metal piece;
- the metal piece or a part of said metal piece is situated in proximity to at least one of the openings;
- at least one of the metal pieces includes a protruding part directed toward at least one of the openings;
- the metal piece is overmolded in the fixed part of the external part;
- the metal piece has an elastic end;
- the metal piece includes a notching means, notably comprising a bossing, capable of preventing a rotary selector from being immobilized between two predefined positions;
- the metal piece is notably made of stainless steel;
- the panel according to the invention is of the multiplexed panel type for the dashboard of an automobile.

The various additional features of the metal piece according to the invention, in as much as they are not mutually exclusive, are combined according to all possibilities of association to obtain different exemplary embodiments of the invention.

The invention and its different applications will be better understood on reading the following description and on studying the accompanying figures.

These are presented only as an indication and are no way limiting of the invention. The figures show:
- in FIG. 1, already previously described, a representation of a panel with modular design of the prior art, seen in profile in a dashboard,
- in FIG. 2, already previously described, a representation of a multiplexed panel of the prior art, seen in profile in a dashboard;
- in FIG. 3, a representation of a multiplexed panel in a first embodiment according to the invention;
- in FIG. 4, a representation of a multiplexed panel in a second embodiment according to the invention;
- in FIG. 5, a representation of a multiplexed panel in a third embodiment according to the invention.

The various elements that appear in the various figures will, unless specified otherwise, have retained the same references. The dimensions given are, unless otherwise specified, expressed in millimeters.

FIGS. 3, 4 and 5 show three exemplary embodiments of a multiplexed panel according to the invention, said multiplexed panel notably consisting of two parts: an external part 1 and an internal part, respectively corresponding to a visible part and a part that is not visible to the user.

In these various examples, the external part 1 notably comprises a fixed part 2, a pushbutton 5 and a rotary selector 6. Between the fixed part 2 and each button (pushbutton 5 and rotary selector 6) there are openings 3 that let air pass through.

The internal part notably comprises a printed circuit 12, here a double-sided printed circuit—but in other exemplary embodiments the printed circuit may be a single-sided circuit, comprising an electric ground line 15 and a microprocessor 13 connected to said printed circuit 12. An optical detector 4 is situated under the rotary selector 5 of the external part 1: this is used to detect the rotational position of said rotary selector 5.

FIG. 3 represents a multiplexed panel 300 in a first embodiment.

The finger of a user, moving towards the multiplexed panel 300, includes static electricity. This static electricity enters into the multiplexed panel 300 through the air situated at the openings 3. The discharge when the user moves his or her finger toward the plastic of the multiplexed panel 300 can then reach the microprocessor 13 and damage it.

For this reason, in the internal part 310, there is at least one metal piece 320; this metal piece 320 is situated facing one of the openings 3. As a general rule, a metal piece is said to be situated in proximity to an opening if at least a part of said metal piece is situated at a small distance, less than twenty-five millimeters, from said opening, without any element being situated between the opening and the part concerned. The metal piece 320 notably includes at least one flat part 323, a protruding part 322 and a conductive tab 321. In other exemplary embodiments, the metal piece positioned in this way may be limited to a simple protruding part, with no flat part. The cavities into which the conductive tabs are inserted are advantageously metalized holes, notably when the electronic card is of the double-sided type.

By extending on either side of the opening 3 the metal piece 320 is able to pick up and conduct toward the ground the static electricity of the user by the flat part 323, parallel to the printed circuit 12.

The protruding part 322 enhances the recovery of the static electricity. The presence of the protruding part 322 makes a straight part 324 of the flat part 323 of the metal piece 320 optional. However, the presence of the straight part 324 constitutes an advantageous embodiment in as much as it constitutes an additional precaution for mitigating a failure of the recovery of the static electricity by the protruding part 322.

The conductive tab 321 is directly linked to the electric ground line 15 of the printed circuit 12, thus serving to discharge the static electricity and to protect the electronic components. This conductive tab 321 is inserted into a through-cavity 14 of the printed circuit 12, said cavity 14 advantageously making it possible to secure the metal piece 320. In other exemplary embodiments the conductive tab may be soldered to the printed circuit.

FIG. 4 represents a multiplexed panel 400 in a second embodiment.

As for the preceding FIG. 3, the finger of a user moving toward the multiplexed panel 400 includes static electricity. This static electricity enters into the multiplexed panel 400 through the air situated at the openings 3. The discharge, when the user moves towards the plastic of the multiplexed panel 400, can then reach the microprocessor 13 and damage it.

To prevent such a damaging discharge, the internal part 410 contains at least one metal piece 420; this metal piece 420 is, as an example, overmolded in the fixed part 2 in proximity to the opening 3, thus making it possible to attract and recover the static electricity of the user. The metal piece 420, overmolded in the fixed part 2, includes at least one conductive tab 421 inserted into a cavity 14 of the printed circuit 12, and providing a securing function, and making it possible to discharge the static electricity of the user via the electric ground line 15 of the printed circuit 12.

FIG. 5 represents a multiplexed panel 500 in a third embodiment.

The internal part 510 contains at least one metal piece 520 represented under the pushbutton 5; this metal piece 520 notably includes an oblique protruding part 523. This oblique protruding part 523 is elastic so as to advantageously enable the pushbutton 5 to return to its initial position when the user has finished exerting a pressure on said pushbutton 5. Apart from this form, giving the metal piece 520 the same characteristics as a spring, the two protruding parts 522 and 523 make it possible to discharge the static electricity of the user, via the conductive tab 521, inserted into the cavity 14 of the printed circuit 12 via the electric ground line 15 of said printed circuit 12.

Similarly, for the rotary selector 6, a metal piece 530 includes a bossing 533 on the protruding part 532 of said metal piece 530. The rotary selector 6 includes grooves in its bottom part, advantageously enabling the user to feel that he is correctly rotating said rotary selector 6. The bossing 533 cooperating with the grooves of the rotary selector 6 creates a notching effect felt by the user when he or she rotates the selector. This notching effect is thus obtained economically by the use of a metal piece 530 which is also intended to protect the electronic card against electrostatic discharges. Apart from this form giving the metal piece 530 an additional mechanical characteristic, the protruding part 532 makes it possible to discharge the static electricity of the user, via the conductive tab 531 inserted into the cavity 14 of the printed circuit 12 via the electric ground line 15 of said printed circuit 12.

In the example represented, a third metal piece 540 simply consists of a flat part 541 and a conductive tab 542 inserted into a through-cavity 543 of the printed circuit. The arrangement of the flat part 541 is such that it is able to pick up the electrostatic discharges arising from two openings 3 situated on either side of a portion of the fixed part 2.

The recovery of the static electricity of the user by the metal pieces (320; 420; 520; 530), advantageously made of stainless steel, allows for an effective protection of the electronic component, notably the microprocessor 13.

The invention claimed is:

1. An electronic control panel, comprising:
   an external part that comprises at least one button and a fixed part, each button and said fixed part having an opening between them;
   an internal part comprising a printed circuit; and
   at least one metal piece suitable for picking up static electricity, present at at least one of the openings, wherein the at least one metal piece is configured to remove the static electricity, thereby preventing the static electricity from affecting the printed circuit,
   wherein the at least one metal piece is linked to an electric ground line of the printed circuit, and
   wherein the at least one metal piece comprises at least one conductive tab linked to the electric ground line of the printed circuit and inserted into a cavity of said printed circuit, to produce a securing function for said at least one metal piece.

2. The electronic control panel as claimed in claim 1, wherein the at least one metal piece or a part of said at least one metal piece is situated in proximity to the at least one of the openings.

3. The electronic control panel as claimed in claim 1, wherein at least one of the metal pieces includes a protruding part directed toward the at least one of the openings.

4. The electronic control panel as claimed in claim 1, wherein the at least one metal piece is overmolded in the fixed part of the external part.

5. The electronic control panel as claimed in claim 1, wherein the at least one metal piece has an elastic end.

6. The electronic control panel as claimed in claim 1, wherein the at least one metal piece includes a notching means comprising a bossing capable of preventing a rotary selector from being immobilized between two predefined positions.

7. The electronic control panel as claimed in claim 1, wherein the at least one metal piece is made of stainless steel.

8. The electronic control panel as claimed in claim 1, wherein the electronic control panel is of the multiplexed panel type for automobiles.

9. An electronic control panel, comprising:
   an external part that comprises at least one button and a fixed part, each button and said fixed part having an opening between them;
   an internal part comprising a printed circuit; and
   at least one metal piece suitable for picking up static electricity, present at at least one of the openings, wherein the at least one metal piece is configured to remove the static electricity, thereby preventing the static electricity from affecting the printed circuit,
   wherein the at least one metal piece is linked to an electric ground line of the printed circuit, and
   wherein the at least one metal piece comprises at least one conductive tab linked to the electric ground line of the printed circuit and inserted into a cavity of said printed circuit, to produce a securing function for said at least one metal piece and a bossing configured to prevent a rotary selector from being immobilized between two predefined positions.

* * * * *